United States Patent [19]

Baba

[11] 4,413,237
[45] Nov. 1, 1983

[54] SAWTOOTH WAVE OSCILLATOR

[75] Inventor: Yasuharu Baba, Kawasaki, Japan

[73] Assignee: Sony Corporation, Tokyo, Japan

[21] Appl. No.: 242,394

[22] Filed: Mar. 10, 1981

[30] Foreign Application Priority Data

Mar. 14, 1980 [JP] Japan ................................ 55/32954

[51] Int. Cl.³ .......................................... H03K 4/50
[52] U.S. Cl. ............................... 331/108 C; 307/228;
328/183; 328/184; 331/111; 357/51
[58] Field of Search ............... 331/108 C, 108 D, 111;
307/228, 246, 320; 328/181, 183, 184, 185;
357/51

[56] References Cited

U.S. PATENT DOCUMENTS 3,723,762  3/1973  Nakaya ........................... 328/184 X
4,147,996  4/1979  Gontowski, Jr. .................... 331/111
4,214,252  7/1980  Goerth ............................ 307/320 X Primary Examiner—Siegfried H. Grimm
Attorney, Agent, or Firm—Hill, Van Santen, Steadman & Simpson

[57] ABSTRACT

A sawtooth wave oscillator is disclosed which includes a series connection consisting of a charging circuit and a first capacitor, a voltage dependent capacitor connected in parallel to the first capacitor, and a discharging circuit connected in parallel to the first capacitor, whereby a sawtooth wave which has good linearity can be generated with a simple circuit construction.

4 Claims, 11 Drawing Figures

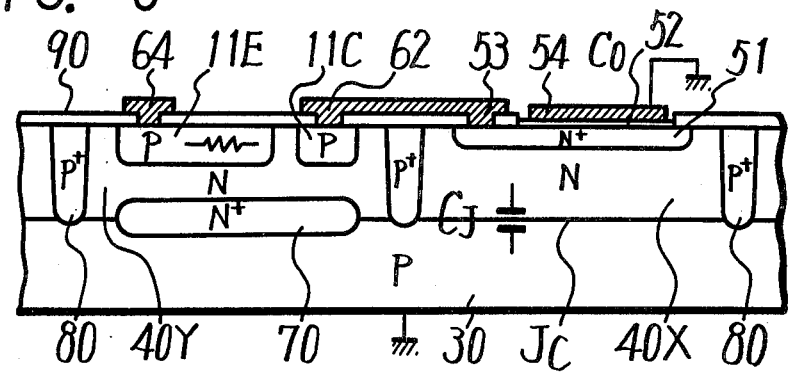
FIG. 6
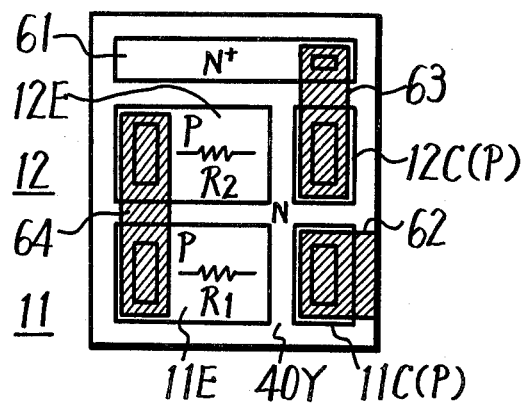
FIG. 7
FIG. 8
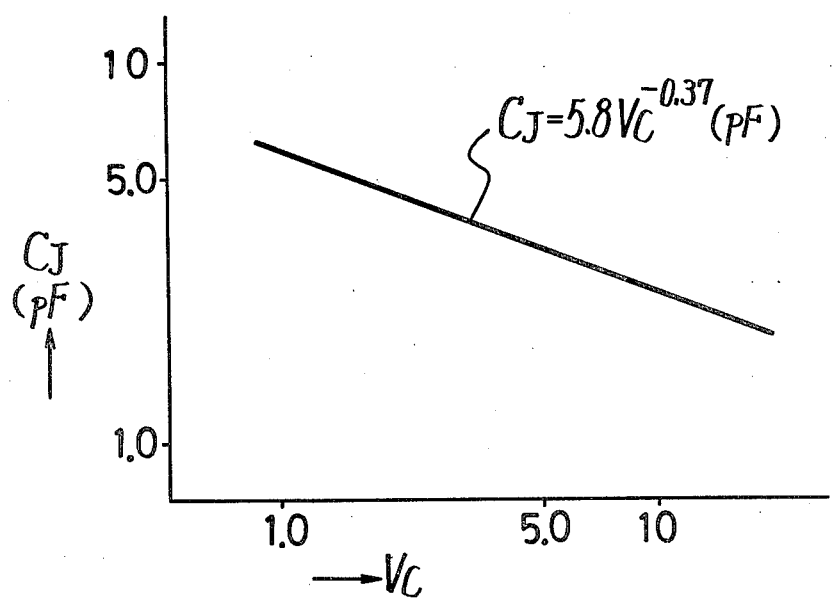

SAWTOOTH WAVE OSCILLATOR

BACKGROUND OF THE INVENTION

1. Field of the Invention

The present invention relates generally to a sawtooth wave oscillator and is directed more particularly to a sawtooth wave generator which is simple in construction.

2. Description of the Prior Art

In the art, a sawtooth wave generator can not generate a sawtooth wave which has good linearity because the sawtooth wave generated from the prior art sawtooth generators has dull tops.

OBJECTS AND SUMMARY OF THE INVENTION

Accordingly, an object of the present invention is to provide a novel sawtooth wave oscillator which can produce a sawtooth wave which has good linearity.

Another object of the invention is to provide a sawtooth wave oscillator which is simple in construction but generates a sawtooth wave which has good linearity.

According to an aspect of the present invention there is provided a sawtooth wave oscillator which comprises:

(a) a series circuit of a charging means and a first capacitor;

(b) a voltage dependent capacitor connected in parallel to said first capacitor; and (c) a discharging means connected in parallel to said first capacitor.

The additional, and other objects, features and advantages of the present invention will become apparent from the following description taken in conjunction with the accompanying drawings in which the like references designate the same elements.

BRIEF DESCRIPTION OF THE DRAWINGS

FIG. 6 is a cross-sectional view of a semiconductor device in which an example of the invention is provided;

FIG. 7 is a plan view of FIG. 6; and

FIGS. 8 and 9 are respectively graphs illustrating the characteristics used to explain the invention.

DESCRIPTION OF THE PREFERRED EMBODIMENT

In order to facilitate the understanding of the present invention, a prior art sawtooth wave oscillator or generator will be first described with reference to FIGS. 1 and 2.

Figure 1:
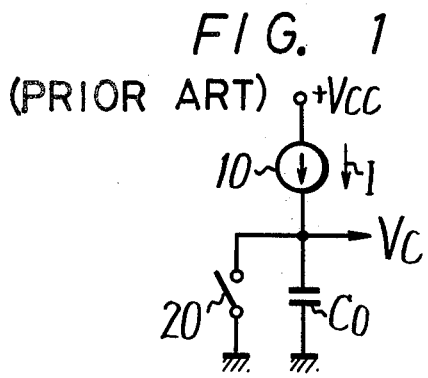
FIG. 1 is a circuit diagram showing the theoretical construction of a prior art sawtooth wave oscillator.

FIG. 1 shows the theoretical construction of the prior art triangular wave oscillator or generator which is used to generate a sawtooth wave. In FIG. 1, $C_o$ designates a capacitor or capacitance element. A constant current source 10 for charging the capacitance element $C_o$ is connected in series thereto and a switch 20 for discharging the capacitance element $C_o$ is connected in parallel thereto.

Figure 2:
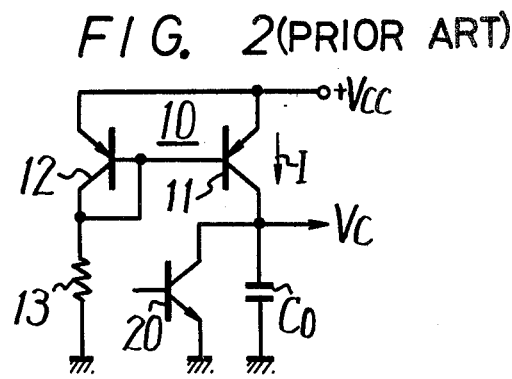
FIG. 2 is a connection diagram showing a practical example of the prior art sawtooth wave oscillator shown in FIG. 1.

FIG. 2 shows a practical circuit construction of the triangular wave generator shown in FIG. 1. As shown in FIG. 2, the constant current source 10 is formed of a PNP-type transistor 11, a PNP-type transistor 12, which is connected as a diode to apply a constant bias voltage to the base of the transistor 11, and a resistor 13. Current I flows through the transistor 11. In this example, the switch 20 is made of an NPN-type transistor.

Figure 3A:
FIGS. 3A, 3B and 3C are respectively waveform diagrams used to explain the present invention.

For the above prior art triangular wave generator, it is ideal that the output impedance of the constant current source 10 be infinite and the capacitance element $C_o$ is not dependent on the voltage. If the above condition is satisfied, a triangular or sawtooth wave as a terminal voltage $V_c$ across the capacitance element $C_o$ is produced which has good linearity as shown in FIG. 3A by the solid line.

In fact, however, although a capacitor or capacitance element having no dependency on the applied voltage can be easily made, it is difficult to obtain a constant current source 10 with output infinite impedance. That is, if the constant current source 10 is formed from transistor 11, its early intercept voltage is relatively low. Therefore, as the terminal voltage $V_c$ increases, the current I flowing into the capacitance element $C_o$ decreases. As a result, the waveform of the terminal voltage $V_c$ becomes such that the upper portion thereof is curved as shown in FIG. 3A by the broken line.

Now, the present invention which is free from the above defects inherent in the prior art will be described.

The present invention is based upon the fact that the capacitance of a PN junction is dependent on the voltage, namely as the reverse bias applied to the PN junction becomes high, the capacitance thereof becomes low.

This invention utilizes the above fact or positively utilizes the junction capacitance to provide a sawtooth or triangular wave which has good linearity.

Figure 4:
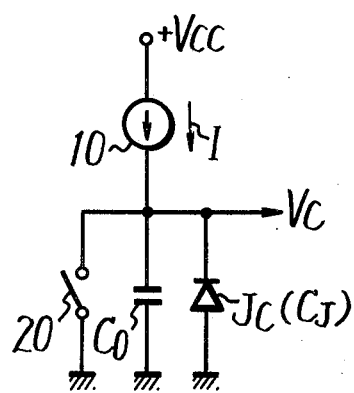
FIG. 4 is a circuit diagram showing the theoretical construction of the sawtooth wave oscillator according to the invention.

FIG. 4 shows the theoretical construction of the sawtooth wave oscillator according to the present invention in which the references which are the same as those used in FIG. 1 designate the same elements and which will produce a sawtooth wave.

In the construction shown in FIG. 4, a PN junction $J_c$ i.e. junction capacitance element $C_J$ is connected in parallel to the capacitance element $C_o$ which is not dependent on the voltage. The charging constant current source 10 is connected in series to the parallel circuit of the capacitance element $C_o$ and the junction capacitance element $C_J$, and the discharging switch 20 is connected in parallel to the parallel circuit or capacitance element $C_o$.

Figure 5:
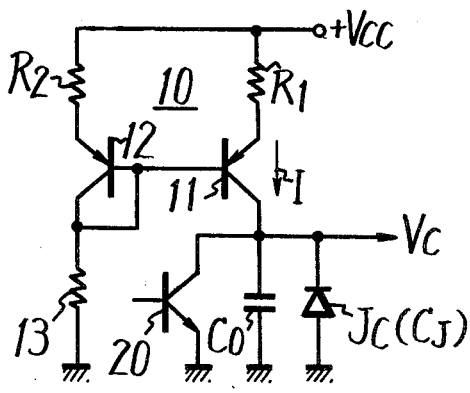
FIG. 5 is a connection diagram showing a practical example of the sawtooth wave oscillator shown in FIG. 4.

A practical example of the sawtooth wave oscillator shown in FIG. 4 is depicted in FIG. 5 in which the references which are the same as those used in FIGS. 4 and 2 designate the same elements. As shown in FIG. 5, the constant current source 10 is formed of the PNP-type transistor 11, the PNP-type transistor 12, which is connected as a diode to apply a constant bias voltage to the base of the transistor 11, and the resistor 13. Current I flows through the transistor 11. In this example, the switch 20 is also made of an NPN-type transistor.

In this example of the invention, in order to adjust the early intercept voltage of the transistor 11 if necessary, a resistor $R_1$ is connected to its emitter. A resistor $R_2$ is also connected to the emitter of the transistor 12.

The capacitance element $C_o$ is not dependent on the voltage and is formed in a semiconductor device in which the PN junction $J_c$ is also formed.

FIGS. 6 and 7 illustrate an example of the semiconductor device. In this example, on a P-type substrate 30 are formed N-type epitaxial grown layers 40X and 40Y. On the layer 40X there is formed an N+-type diffusion region 51 on which a thin dielectric 52 layer such as silicon-nitride or the like is formed. An electrode 53 is formed on the region 51 and an electrode 54 is formed on the dielectric 52. Thus, the capacitance element $C_o$ which is not voltage dependent is formed. In this case, the PN junction $J_c$ is between the substrate 30 and the layer 40X. By grounding the substrate 30 and the electrode 54, respectively, the PN junction $J_c$ i.e. junction capacitance element $C_J$ is connected in parallel to the capacitance element $C_o$ which is not dependent on the voltage.

Further, on the layer 40Y, respectively, there are formed P-type diffusion regions 11E, 11C, 12E and 12C to provide the PNP-type lateral transistor 11 which has the emitter region made of the region 11E, the base region of the layer 40Y and the collector region of the region 11C. The PNP-type lateral transistor 12 has the emitter region made of the region 12E, the base region of the layer 40Y and the collector region of the region 12C, respectively. An N+-type diffusion region 61 is formed on the layer 40Y for leading out a base electrode, and an electrode 62 is formed on the collector region 11C of the transistor 11. An electrode 63 is formed to lie over both the collector region 12C of the transistor 12 and the region 61, and an electrode 64 is formed to lie over the emitter region 11E of the transistor 11 and region 12E of the transistor 12. The resistors $R_1$ and $R_2$ are respectively provided by making both the emitter regions 11E and 12E wide in width and the electrode 64 is formed on one side portion of each of the emitter regions 11E and 12E as shown in the figures, especially in FIG. 7.

In FIG. 6, 70 designates a buried region of an N+-type, 80 a P+-type diffusion region for isolation, and 90 a SiO$_2$ layer, respectively.

As set forth previously, it is difficult to make the output impedance of the constant current source 10 infinite. In other words, the early intercept voltage of the transistor 11 is relatively low. Accordingly, in the case where the total capacitance element C is charged by the current I from the constant current source 10, as the terminal voltage $V_c$ becomes high, the current I decreases. That is, if it is assumed that the power source voltage is taken as $V_{cc}$ and the early intercept voltage of the transistor 11 as $V_A$, the current I is expressed as follows:

$$I = \frac{V_{cc} + V_A - V_c}{V_A} I_o$$

where $I_o$ is the collector current of the transistor 11 at $V_{cc}=0$.

According to the present invention, however, the total capacitance element C is formed of the capacitance element $C_o$ which is not dependent on the voltage and the junction capacitance element $C_J$ and the total capacitance C thereof is expressed as follows:

$$C = C_o + C_J \qquad (2)$$

Thus, the capacitance $C_J$ and accordingly the capacitance C is dependent on the voltage. That is, as the terminal voltage $V_c$ becomes high, the capacitance C decreases. Therefore, if the early intercept voltage $V_A$ of the transistor 11 and the capacitance $C_J$ i.e. the voltage dependency of the capacitance C are selected suitably, the time variation of the terminal voltage $V_c$, which is expressed by the following expression (3), will be constant which will make the linearity good.

$$\frac{\Delta V_c}{\Delta t} = \frac{I}{C} = \frac{(V_{cc} + V_A - V_c) I_o}{V_A (C_o + C_J)} \qquad (3)$$

Figure 9:
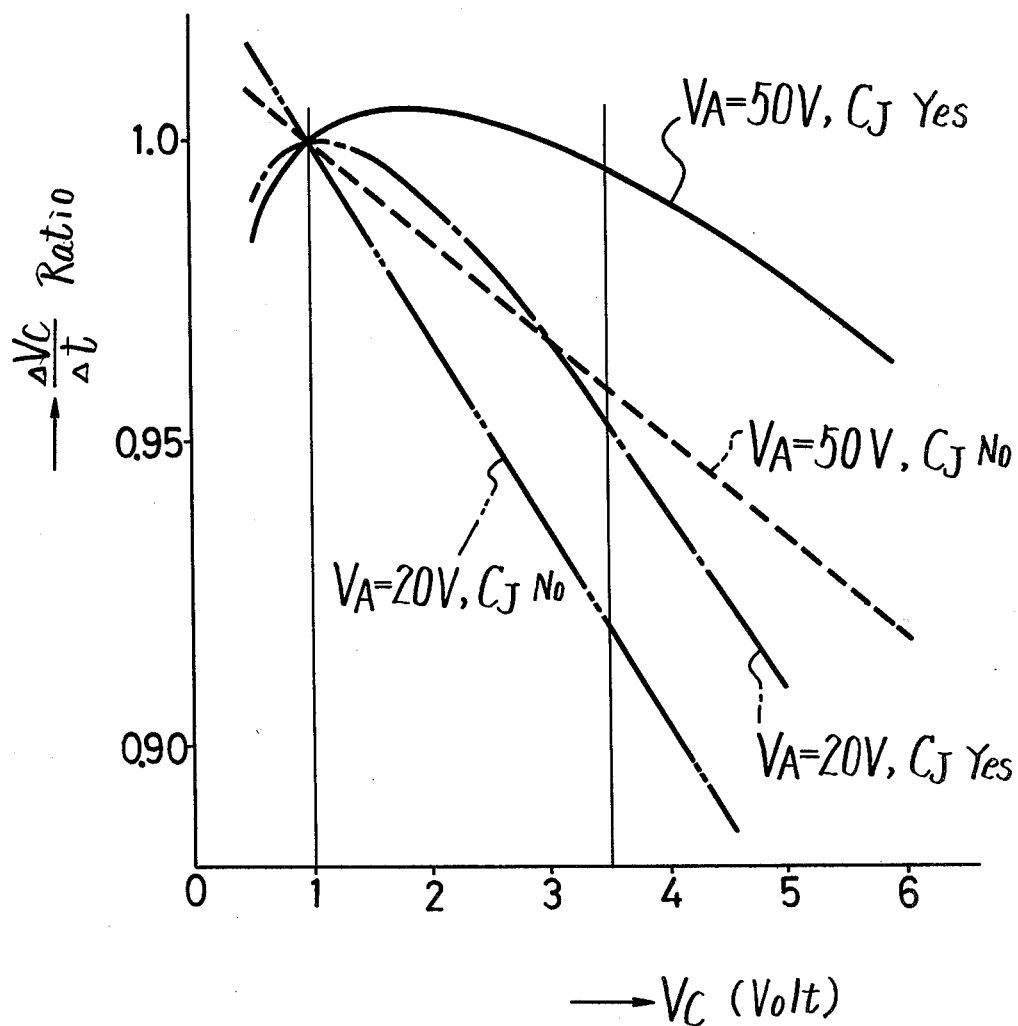

As shown in the graph of FIG. 8, if the junction capacitance $C_J$ is selected so as to be expressed by the following expression (4)

$$C_J = 5.8 \, V_c^{-0.37} \mathrm{pF} \qquad (4)$$

and the capacitance $C_o$ is selected to be 56pF ($C_o = 56$pF) and the power source voltage $V_{cc}$ is selected to be 12V ($V_{cc} = 12$ V) and the time variation of the terminal voltage $V_c$ is calculated for the respective cases where the early intercept voltage $V_A$ is 20V and 50V ($V_A = 20$V and $V_A = 50$V), the graph of FIG. 9 is obtained. In this graph, the value of $\Delta V_c / \Delta t$ is taken as 1 when the terminal voltage $V_c$ is 1V ($V_c = 1$V).

From the graph of FIG. 9, it will be apparent that when the junction capacitance $C_J$ having voltage dependency expressed by the expression (4) is added and the early intercept voltage $V_A$ is selected as 50V ($V_A = 50$V), $\Delta V_c / \Delta t$ will vary by only ±0.5% in the range of 1 to 3.5V of the terminal voltage $V_c$ and hence the linearity is greatly improved.

Figure 3B:
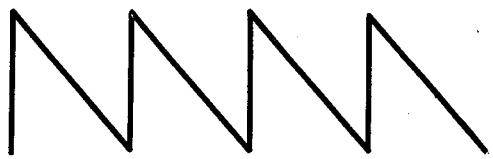
Figure 3C:
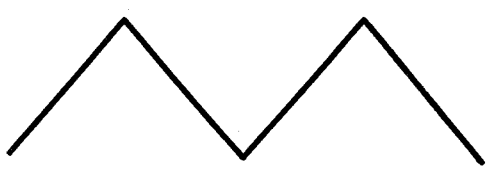

The above example of the invention is a case where the constant current source is provided for charging the capacitance element and the switch is provided for discharging the capacitance element to produce the triangular or sawtooth wave shown in FIG. 3A by the solid line. The present invention, however, can be applied with the same effect to a case where the switch is provided for the charging and the constant current source is provided for the discharging to produce a triangular or sawtooth wave shown in FIG. 3B, and where constant current sources are respectively provided for the charging and discharging to provide a triangular or sawtooth wave shown in FIG. 3C. In this case, the constant current sources may be formed of a resistor having high resistance value.

It will be apparent that many modifications and variations could be effected by one skilled in the art without departing from the spirit or scope of the novel concepts of the present invention so that the spirit or scope of the invention should be determined by the appended claims only.

I claim as my invention:
1. A sawtooth wave oscillator comprising:
    (a) a series circuit of a first capacitor means and a charging means for producing a first current;
    (b) a discharging means connected in parallel with said first capacitor means; and
    (c) a second capacitor means having a capacitance which decreases in accordance with increase of the reverse bias across said second capacitor means and connected in parallel with said first capacitor means and their terminals connected together wherein decrease of said current due to increase of voltage at the junction point of said charging means and said first capacitor means corresponds to the decrease of capacitance of said second capacitor means, so that the non-linearity sawtooth wave caused by decrease of said first current is improved.

2. A sawtooth wave oscillator according to claim 1, wherein said first capacitor means and said second capacitor means are fabricated in the same semiconductor device.

3. A sawtooth wave oscillator according to claim 1, wherein said charging means and discharging means are composed of transistors, respectively.

4. A sawtooth wave oscillator according to claim 3, wherein said first capacitor means, said second capacitor means, said charging means and said discharging means are fabricated in the same semiconductor device.

* * * * *